United States Patent
Chen et al.

(10) Patent No.: US 9,958,912 B2
(45) Date of Patent: May 1, 2018

(54) TWO RACK UNIT CHASSIS AND LOW PROFILE TOOL-LESS HARD DRIVE CARRIER

(71) Applicant: Quanta Computer Inc., Taoyuan (TW)

(72) Inventors: Chao-Jung Chen, Taoyuan (TW);
Yaw-Tzorng Tsorng, Taoyuan (TW);
Chih-Hsiang Lee, Taoyuan (TW);
Chun Chang, Taoyuan (TW);
Chih-Wei Lin, Taoyuan (TW);
Chia-Wei Huang, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days. days.

(21) Appl. No.: 15/150,362

(22) Filed: May 9, 2016

(65) Prior Publication Data
US 2017/0322604 A1    Nov. 9, 2017

(51) Int. Cl.
*G06F 1/18*    (2006.01)
*G11B 33/12*   (2006.01)
*H05K 7/14*    (2006.01)

(52) U.S. Cl.
CPC .............. *G06F 1/187* (2013.01); *G06F 1/181* (2013.01); *G11B 33/124* (2013.01); *G11B 33/128* (2013.01); *H05K 7/1409* (2013.01)

(58) Field of Classification Search
CPC ................................ G06F 1/181; G06F 1/187
USPC ..................................................... 361/679.33
See application file for complete search history.

(56) References Cited

U.S. PATENT DOCUMENTS

| | | | |
|---|---|---|---|
| 6,912,124 B2* | 6/2005 | Megason | F16H 51/00 165/104.33 |
| 6,952,341 B2* | 10/2005 | Hidaka | G11B 33/128 312/332.1 |
| 6,957,291 B2* | 10/2005 | Moon | G06F 3/0607 361/679.37 |

(Continued)

FOREIGN PATENT DOCUMENTS

| | | |
|---|---|---|
| CN | 204463821 U | 7/2015 |
| CN | 205004040 U | 1/2016 |

(Continued)

OTHER PUBLICATIONS

Taiwanese Office Action for Application No. 105121209, dated Aug. 14, 2017, w/ First Office Action Summary.

(Continued)

*Primary Examiner* — Adrian S Wilson
(74) *Attorney, Agent, or Firm* — Nixon Peabody LLP; Eduardo J. Quinones; Zhou Lu (57) ABSTRACT

Disclosed is a two rack unit chassis and low profile tool-less hard disk drive carrier (HDD). The two rack chassis including a plurality of HDD bays and a backplane including a plurality of connectors corresponding to the plurality of bays, each bay configured to receive a low profile tool-less carrier. The low profile tool-less carriers each comprising a first latch configured to release a sidewall of the low profile tool-less carrier and receive an HDD, a second latch configured to release a lever having at least one protraction at an inward end, and the lever configured to couple the at least one protrusion of the low profile tool-less carrier to the connector of the corresponding bay to which the low profile tool-less carrier is inserted.

19 Claims, 9 Drawing Sheets

(56) References Cited

U.S. PATENT DOCUMENTS

| | | | |
|---|---|---|---|
| 7,394,660 B2* | 7/2008 | Hidaka | G11B 33/126 361/724 |
| 7,542,295 B2* | 6/2009 | Imsand | G06F 1/181 361/724 |
| 7,701,707 B2* | 4/2010 | Peng | G11B 33/124 248/618 |
| 7,864,519 B2* | 1/2011 | Lin | G11B 33/128 361/679.33 |
| 8,243,435 B2* | 8/2012 | Li | G11B 33/124 312/223.2 |
| 8,310,828 B2* | 11/2012 | Collins | G11B 33/08 29/603.03 |
| 8,456,832 B1 | 6/2013 | Brigham, Jr. et al. | |
| 8,720,043 B2* | 5/2014 | Corddry | H05K 7/20836 29/428 |
| 8,749,966 B1 | 6/2014 | Boudreau et al. | |
| 9,134,771 B2* | 9/2015 | Klein | G06F 1/187 |
| 2002/0144044 A1* | 10/2002 | Moon | G06F 3/0607 710/302 |
| 2005/0219826 A1* | 10/2005 | Carlson | G11B 33/128 361/724 |
| 2005/0257232 A1* | 11/2005 | Hidaka | G11B 33/126 720/654 |
| 2006/0012950 A1* | 1/2006 | Shih | G06F 1/184 361/679.33 |
| 2006/0050487 A1* | 3/2006 | Wu | G06F 1/184 361/724 |
| 2007/0030639 A1* | 2/2007 | Ko | G11B 33/1493 361/679.34 |
| 2007/0127204 A1* | 6/2007 | Muenzer | G06F 1/181 361/679.58 |
| 2007/0230111 A1* | 10/2007 | Starr | G11B 33/125 361/679.31 |
| 2008/0037209 A1* | 2/2008 | Niazi | G06F 1/181 361/727 |
| 2008/0135503 A1* | 6/2008 | Hidaka | H05K 7/16 211/26 |
| 2008/0191590 A1 | 8/2008 | Lin et al. | |
| 2009/0059507 A1* | 3/2009 | Peng | G11B 33/124 361/679.33 |
| 2009/0103252 A1* | 4/2009 | Peng | G11B 33/124 361/679.4 |
| 2009/0129009 A1* | 5/2009 | Zhang | G11B 33/12 361/679.34 |
| 2009/0257187 A1* | 10/2009 | Mills | H05K 7/20727 361/679.33 |
| 2010/0187957 A1* | 7/2010 | Liang | G06F 1/187 312/223.2 |
| 2010/0284145 A1* | 11/2010 | Kang | G06F 1/181 361/679.58 |
| 2012/0075795 A1* | 3/2012 | Petruzzo | G06F 1/181 361/679.48 |
| 2014/0293523 A1* | 10/2014 | Jau | H05K 7/14 361/679.4 |

FOREIGN PATENT DOCUMENTS

| | | |
|---|---|---|
| TW | 510552 U | 11/2002 |
| TW | M313846 U | 6/2007 |
| TW | M505677 | 7/2015 |

OTHER PUBLICATIONS

Taiwanese Search Report for Application No. 105121209, dated Aug. 14, 2017.

Extended European Search Report for EP Application No. 17169172.8 , dated Oct. 9, 2017.

* cited by examiner

TWO RACK UNIT CHASSIS AND LOW PROFILE TOOL-LESS HARD DRIVE CARRIER

TECHNICAL FIELD

The subject mater herein generally relates to a 2 rack unit (U) chassis and hard drive carriers. More specifically, the subject matter herein relates to increased hard drive capacity in a 2U chassis based on horizontal and vertical layout of low profile tool-less hard drive carriers.

BACKGROUND

Figure 1A:
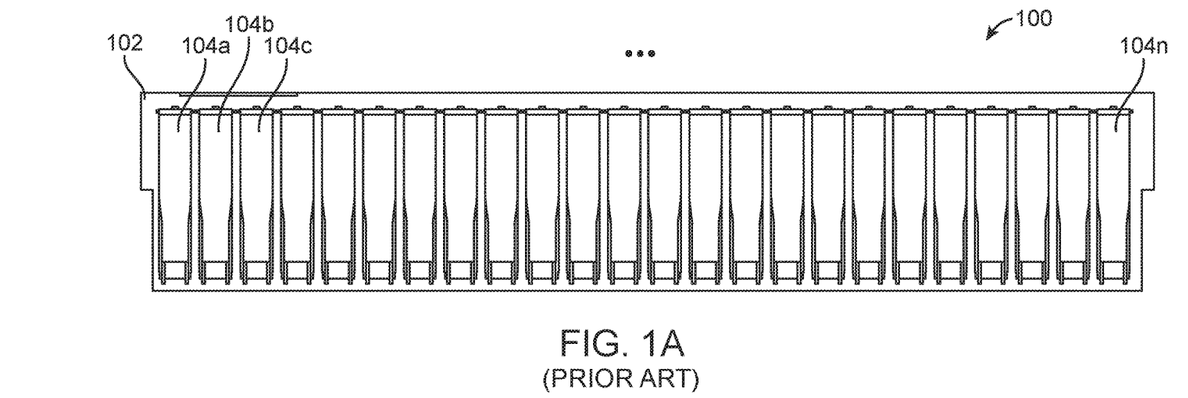
FIG. 1A and FIG. 1B show front views of 2U chassis layout designs of the prior art.
Figure 1B:
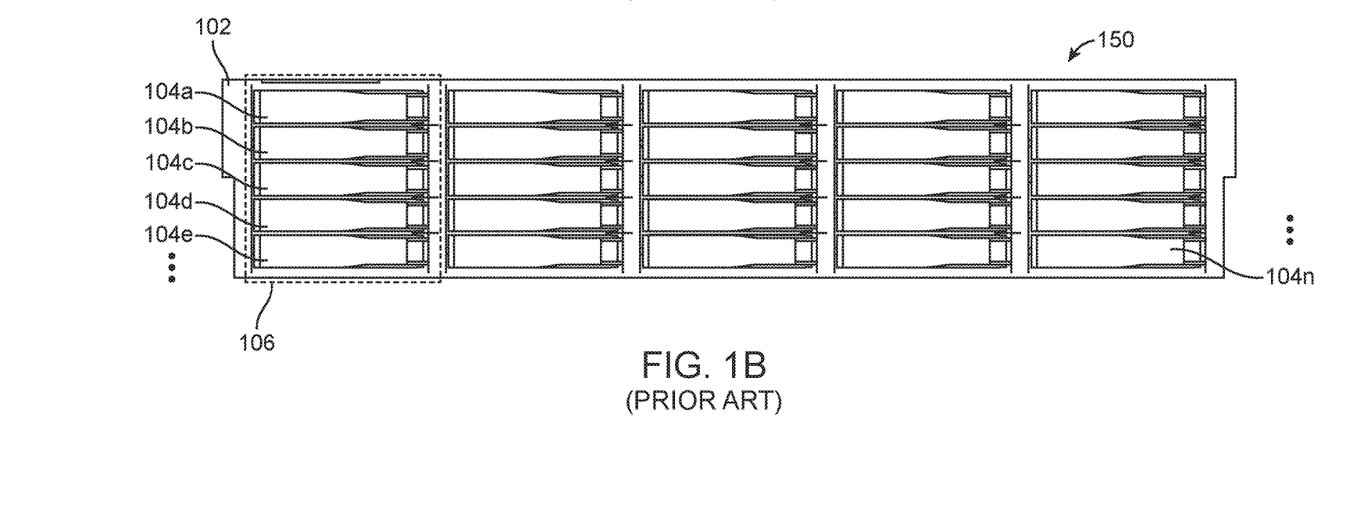

Typical full size racks are 42U, which is approximately 6 feet in height. A full size rack holds approximately twenty-one 2U chassis in uniform alignment. Each 2U chassis can include between 24 and 26 hard disk drives (HDD) of 2.5 inch size. FIG. 1A illustrates a 2U chassis configured in an HDD vertical mode. In HDD vertical mode 100, 2U chassis 102 is configured to receive between 24 and 26 HDDs 104a, 104b, 104c, . . . , 104n (collectively "104"). Each HDD 104 is enclosed in an HDD carrier configured to couple to a backplane of chassis 102. The size of the HDD carrier can be a limiting factor in the number of drives a 2U chassis can receive. FIG. 1B illustrates a 2U chassis configured in an HDD horizontal mode. In HDD horizontal mode 150, 2U chassis 102 is configured to receive 25 HDDs 104.

Thus, a typical full size rack can be configured with twenty-one 2U racks and between 504 and 546 HDDs. An HDD chassis layout and a size of the carrier of the HDD are two limitations hindering the drive capacity in a 2U chassis, and a typical full size rack.

SUMMARY OF THE INVENTION

Additional features and advantages of the disclosure will be set forth in the description which follows, and in part will be obvious from the description, or can be learned by practice of the herein disclosed principles. The features and advantages of the disclosure can be realized and obtained by means of the instruments and combinations particularly pointed out in the appended claims. These and other features of the disclosure will become more fully apparent from the following description and appended claims, or can be learned by the practice of the principles set forth herein.

Disclosed is a low profile tool-less hard disk drive (HDD) carrier. In some examples, the low profile tool-less HDD carrier includes a first, second, third and fourth sidewalls, the first sidewall rotatably mounted to the second sidewall. The carrier can also include a first latch portion on the first sidewall, a second latch portion on the fourth sidewall configured to receive the first latch portion to enclose an HDD, and the third sidewall including a slide latch. The slide latch can be configured to release a lever having at least one protrusion at an inward end, the lever can be configured to couple the at least one protrusion of the low profile tool-less carrier to a connector of a corresponding bay of a chassis to which the low profile tool-less carrier is inserted.

In some examples, the carrier further includes when the slide latch is actuated the lever releases from the front wall of the low profile tool-less carrier by a force of a dual torsion spring. In some examples, when the lever is actuated the at least one protrusion engages a cutout of the chassis and the low profile tool-less carrier is coupled to the backplane by a force of a dual torsion spring and the engagement.

In some examples, insertion of the HDD into the low profile tool-less carrier and insertion of the low profile tool-less carrier into the bay are tool-less. In some examples, the low profile tool-less carrier includes one or more light pipes along one of the two sidewalls configured to display a status received from a backplane, the sidewalls are composed of a material for shielding electromagnetic interference, and the sidewalls are composed of a material for absorbing vibration.

Also disclosed is a two rack unit chassis. The two rack unit chassis including a plurality of hard disk drive (HDD) bays, each bay including an attachment portion for coupling a low profile tool-less carrier and a backplane including a plurality of connectors corresponding to the plurality of bays, each bay configured to receive a low profile tool-less carrier. In some examples, the bays include a subset of vertical bays and horizontal bays. In some examples, the subset of vertical bays include eight bays.

Also disclosed is a two rack unit chassis system with low profile tool-less carriers. The system including a plurality of hard disk drive (HDD) bays and a backplane including a plurality of connectors corresponding to the plurality of bays, each bay configured to receive a low profile tool-less carrier, and a plurality of low profile tool-less carriers, each low profile tool-less carrier. The carriers including a first latch configured to release a sidewall of the low profile tool-less carrier and receive an HDD, a second latch configured to release a lever having at least one protraction at an inward end, and the lever configured to couple the at least one protrusion of the low profile tool-less carrier to the connector of the corresponding bay to which the low profile tool-less carrier is inserted.

BRIEF DESCRIPTION OF THE DRAWINGS

The above-recited and other advantages and features of the disclosure will become apparent by reference to specific embodiments thereof which are illustrated in the appended drawings. Understanding that these drawings depict only example embodiments of the disclosure and are not therefore to be considered to be limiting of its scope, the principles herein are described and explained with additional specificity and detail through the use of the accompanying drawings in which.

DETAILED DESCRIPTION

Various embodiments of the disclosure are discussed in detail below. While specific implementations are discussed, it should be understood that this is done for illustration purposes only. A person skilled in the relevant art will recognize that other components and configurations can be used without parting from the spirit and scope of the disclosure.

The disclosed technology addresses the need in the art for higher capacity storage in 2U chassis of server racks. Current HDD layouts in 2U chassis are either all vertical (as shown in FIG. 1A) or all horizontal (as shown in FIG. 1B). New optimized layouts can provide more storage capacity for each 2U chassis of a server rack. Current HDD carriers are bulky and take up unnecessary space in a 2U chassis. A low profile tool-less carrier in combination with optimized layouts can provided for additional HDDs in a 2U chassis.

Figure 2A:
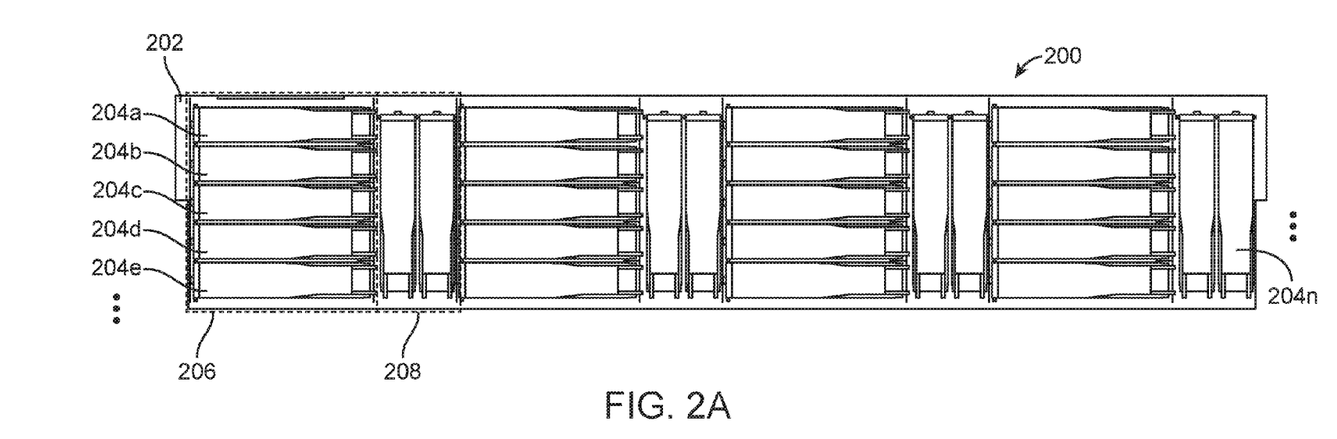
FIG. 2A and FIG. 2B show front views of example 2U chassis layout designs for implementing various embodiments of the present technology.
Figure 2B:
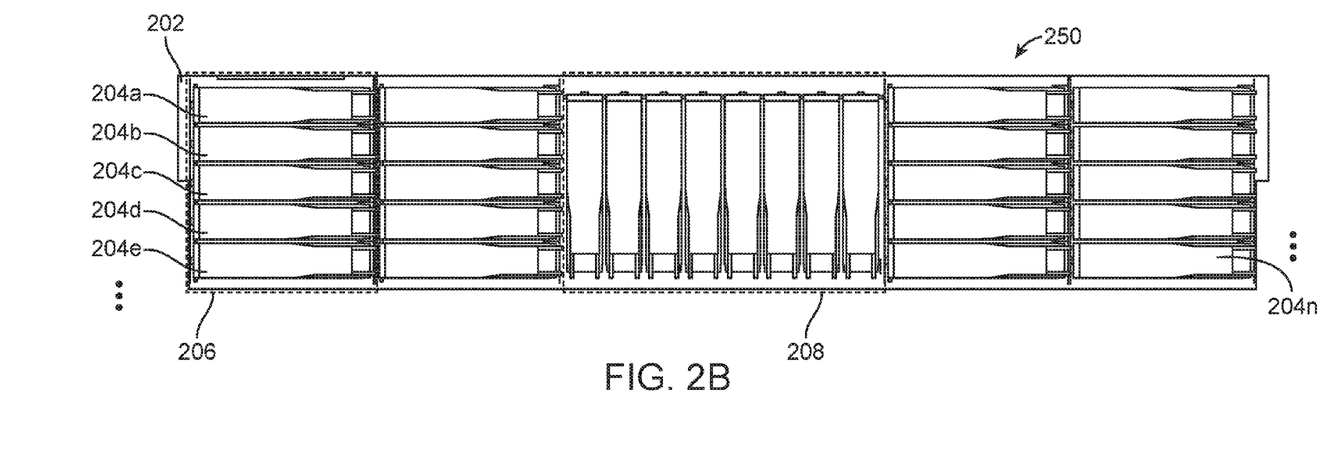

FIG. 2A and FIG. 2B show example 2U chassis layouts for utilizing low profile tool-less carriers. 2U chassis layout 200 can be configured to receive twenty-eight HDDs 204a, 204b, 204c, . . . , 204n (collectively "204"). For example, 2U chassis 200 can include eight HDDs 204 aligned vertically and twenty HDDs 204 aligned horizontal. Subsets of HDDs 204 can be grouped horizontally 206 or vertically 208. For example, vertical groups can include two HDDs as shown in FIG. 2A. In another example, vertical groups can include one group of HDDs, as shown in FIG. 2B. In other example, any number of vertical grouping can be configured including eight HDDs 204. The horizontal groups 206 can be configured in sets of five HDDs 204, as shown in both FIG. 2A and FIG. 2B. Other combination horizontal/vertical configurations are also possible.

Figure 3:
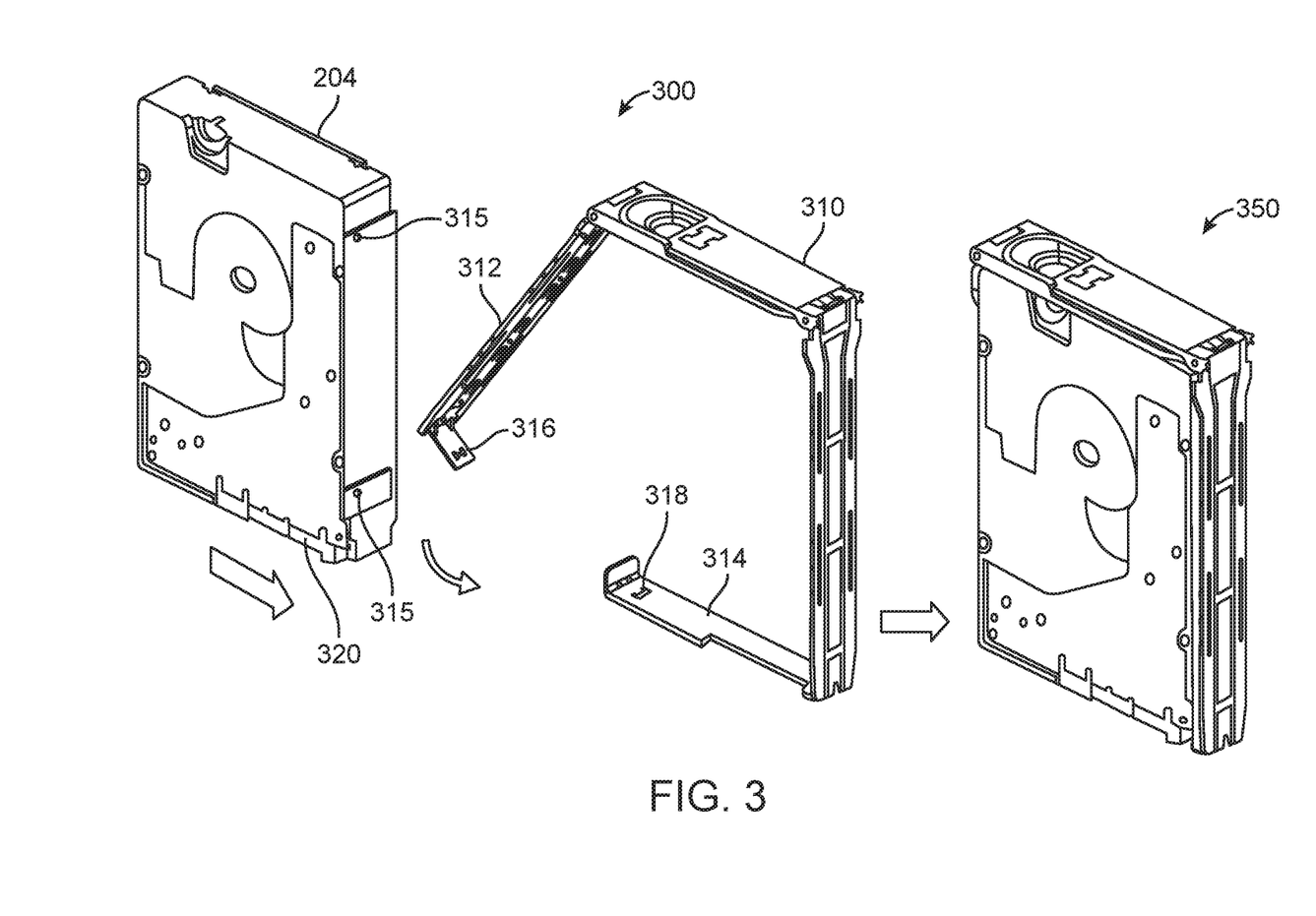
FIG. 3 shows an example low profile tool-less carrier for implementing various embodiments of the present technology.
Figure 4A:
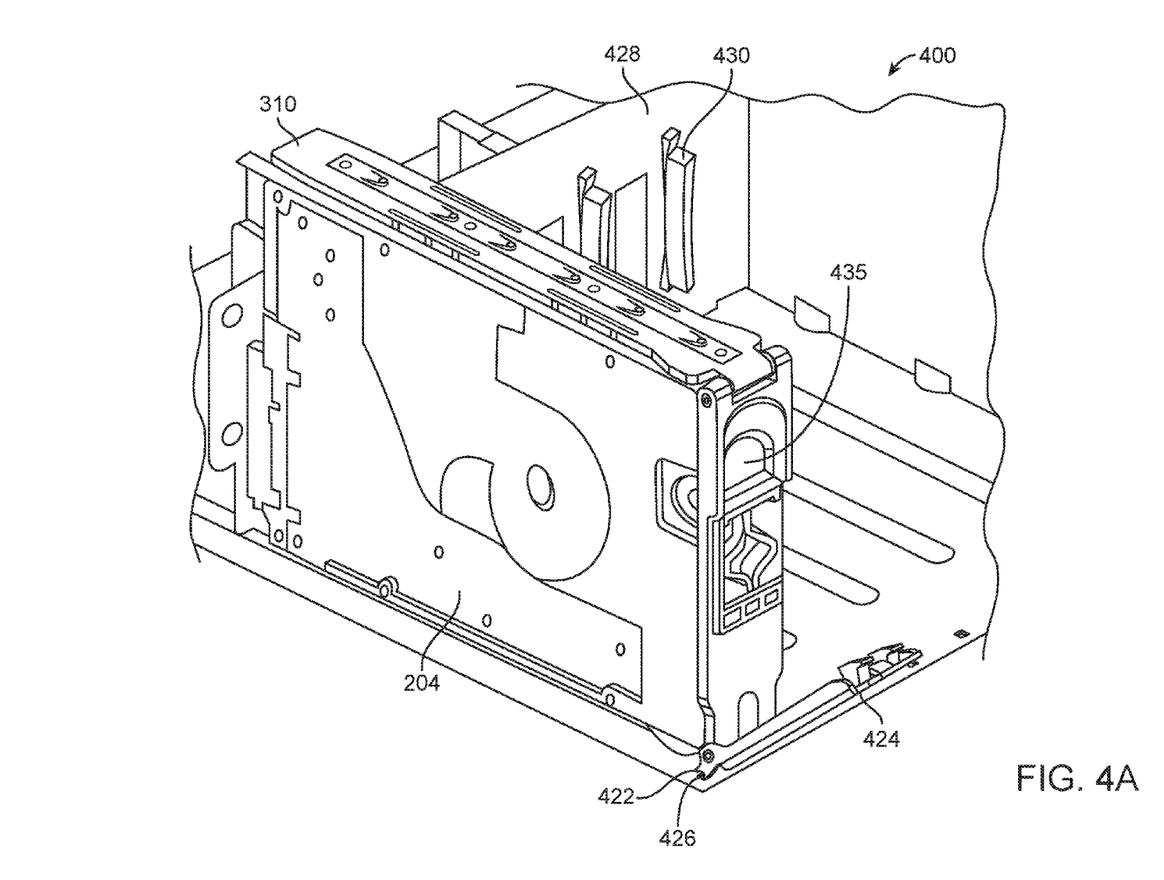
FIG. 4A and FIG. 4B show an example low profile tool-less carrier inserted vertically into a 2U chassis for implementing various embodiments of the present technology.
Figure 4B:
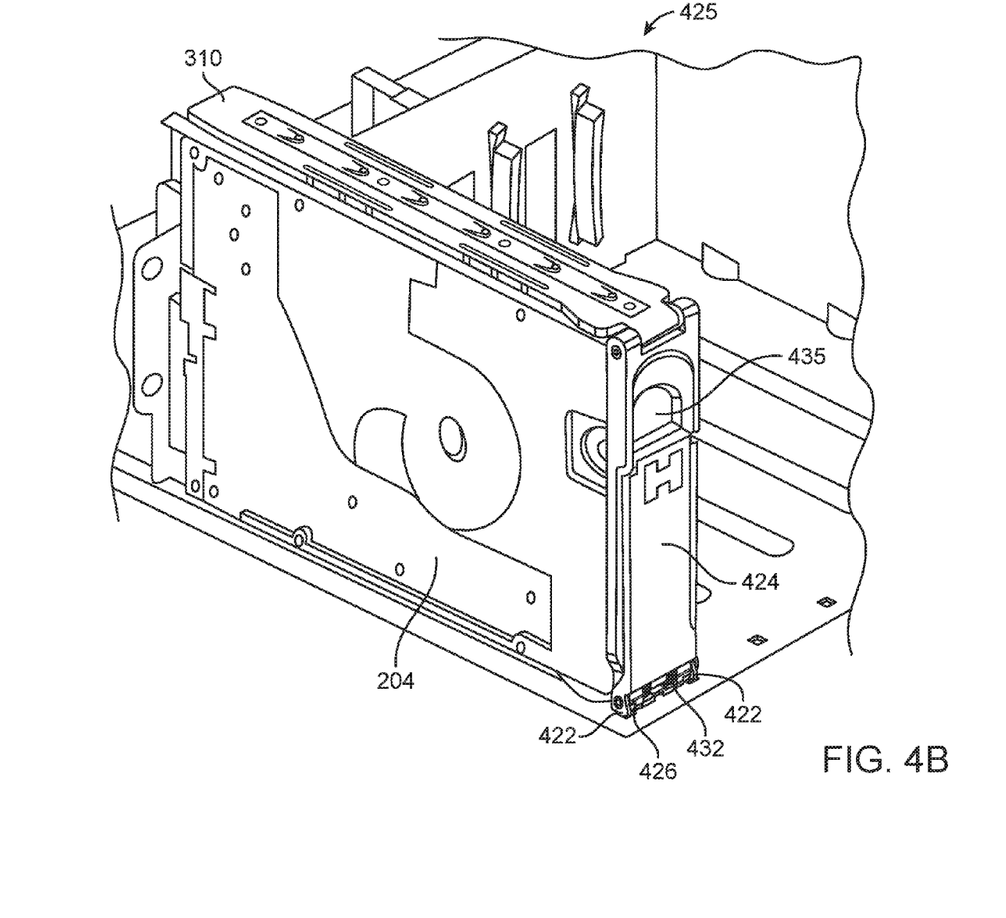
Figure 4C:
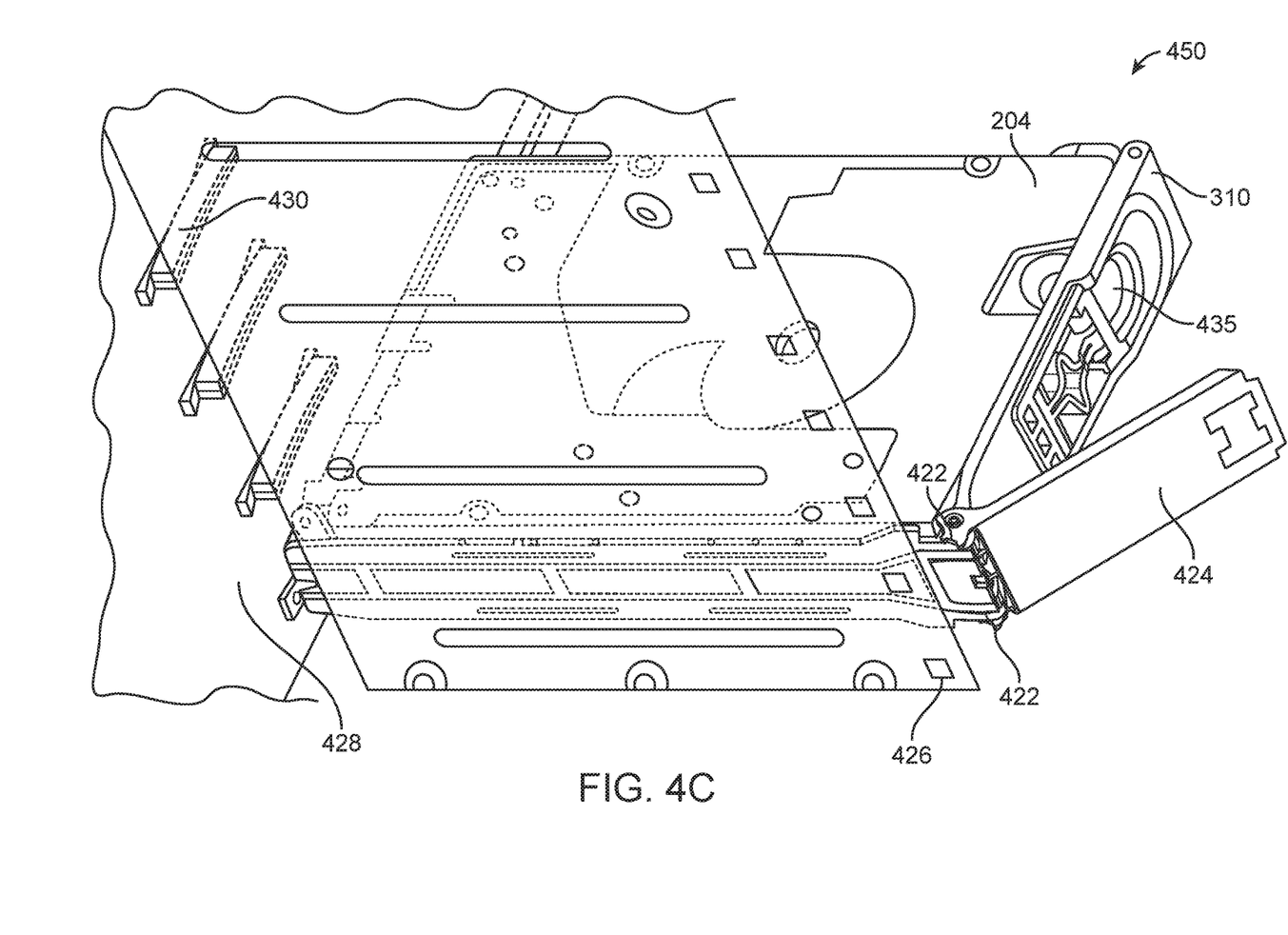
FIG. 4C and FIG. 4D show an example low profile tool-less carrier inserted horizontally into a 2U chassis for implementing various embodiments of the present technology.
Figure 4D:
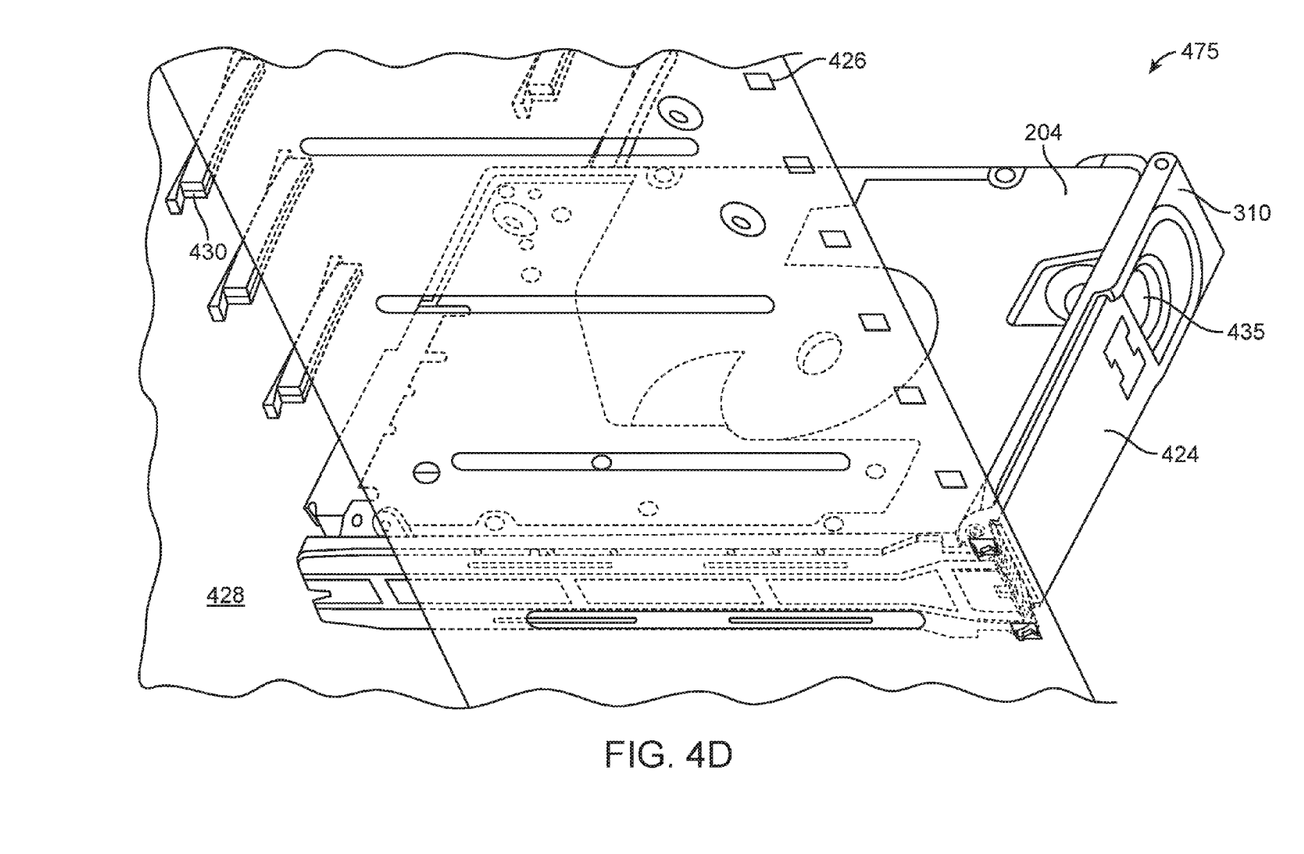

FIG. 3 shows an HDD before 300 and after 350 installation into a low profile tool-less carrier 310 (e.g., small form factor (SFF) carrier, typically designed for a 3.5" hard drive with dimensions of 147 mm (L)×101.6 mm (W)). HDD 204 is inserted into carrier 310 by releasing male latch member 316 from female latch member 318. Releasing male latch member 316 (from female latch member 318) can be performed without the use of a tool. Male latch member 316 is connected to sidewall 312 and female latch member 318 is connected (or constructed into) backwall 314. In alternate examples, either sidewall can include the male latch member or a female latch member. In examples where the female latch member is on either sidewall, the back wall (or front wall) includes a male latch member. In still further alternate examples, a front wall can include either a male or female latch member. The latch members can include different mechanism for releasbly securing the HDD in the low profile tool-less carrier (e.g., cam lock, latch bolt, etc.).

Low profile tool-less carrier 310 can also include pegs 538 (shown in FIG. 5A) located on the inner sidewalls of carrier 310. Pegs 538 can be inserted into holes 315 of HDD 204. The pegs aid in securing HDD 204 in carrier 310. The pegs also prevent HDD 204 from unexpected removal due to orientation of the carrier or gravity. In some examples, there are two pegs on each inner sidewall of the low profile tool-less carrier and two holes on each side of the HDD. In other examples, there can be more or less pegs on the sidewalls and more or less holes on the HDD.

FIGS. 4A-4D show a low profile tool-less carrier before 400 and after 425 vertical installation in a 2U chassis and before 450 and after 475 horizontal installation in a 2U chassis. Low profile tool-less carrier 310 includes a latch 435 (e.g., a slide latch, etc.), which when actuated releases lever 424. Low profile tool-less carrier 310 includes hooks 422 (e.g., protrusions). Hooks 422 are configured to couple with the chassis (at cutouts 426) during installation of the carrier. Low profile tool-less carrier 310 can also include dual torsion spring 532 (shown in FIG. 5A). When the latch 435 is actuated (e.g., slid away from lever 424), the force from dual torsion spring 532 opens lever 424.

When, low profile tool-less carrier 310 is inserted into the chassis, the hooks 422 can couple with cutouts 426 of the chassis. Lever 424 can then be actuated by pushing lever 424 towards the carrier 310. Pushing lever 424 compresses the dual torsion spring 532 and creates a force from the coupling of hooks 422 to cutout 426. The engagement of the hooks 422 with cutouts 426 acts as a fulcrum point, such that force applied to rotated lever 424 toward the carrier 310 converts to a rearward force to couple rear connector 320 (shown in FIG. 2) of HDD 204 to connector 430 of backplane 428. Upon successful coupling with the chassis, lever 424 is held flush to the front face of the carrier by latch 435.

Figure 5A:
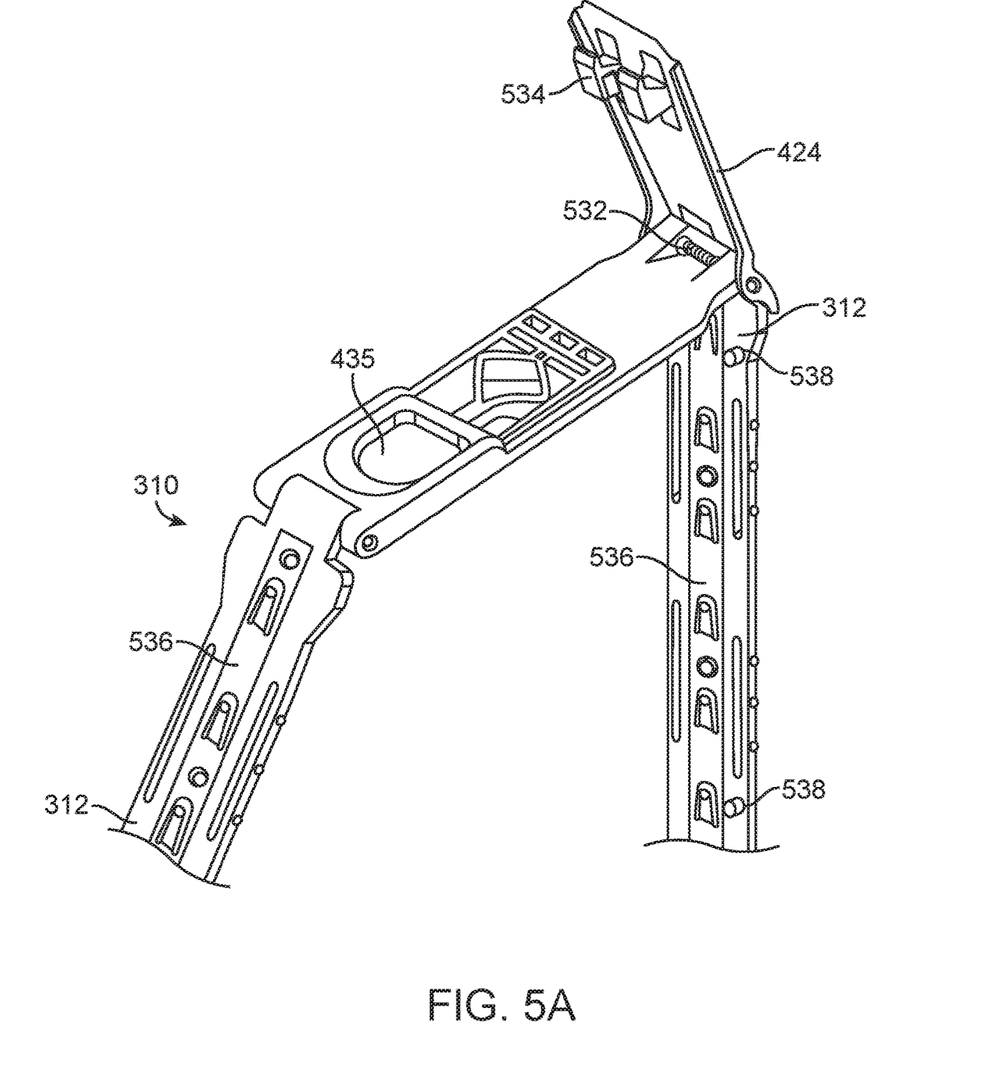
FIG. 5A and FIG. 5B show an example lever and latching mechanism of an example low profile tool-less carrier for implementing various embodiments of the present technology.
Figure 5B:
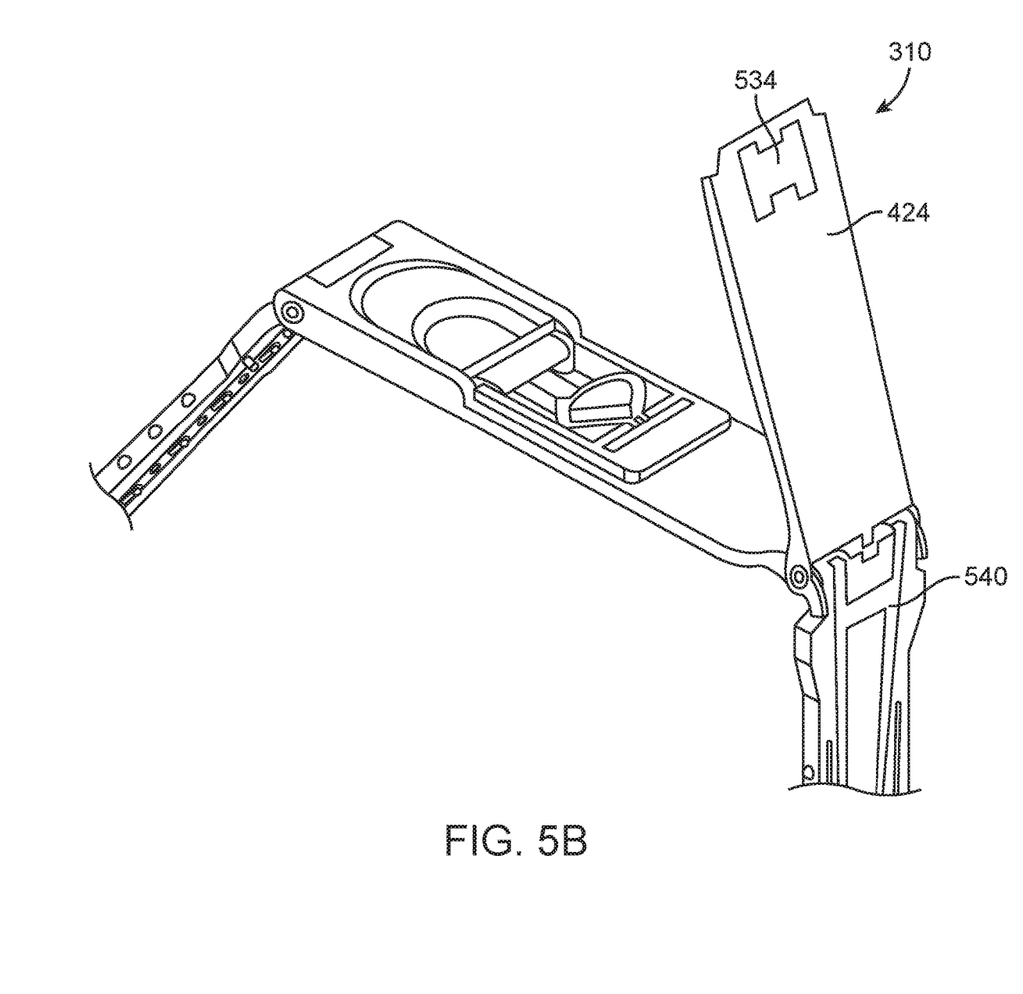

FIGS. 5A and 5B show a detailed view a low profile low profile tool-less carrier with the lever in a released position. In the closed position, latch 435 can be actuated away (e.g., slid, etc.) from lever 424. The actuation (e.g., sliding) of latch 435 releases lever 424 by uncoupling attachment portion 534. Upon actuation of dual torsion spring 532 forces lever 424 away from carrier 504.

Carrier 310 can also include strips 536. Strips 536 run along one or both sidewalls 312 of carrier 310. Strips 536 can be composed of any other material capable of shielding electromagnetic interference with the HDD (e.g., sheet metal, steel, metallic ink, metal screen, metal foam, copper, nickel, etc.). Sidewalls 312 are also composed of any material capable of absorbing vibration from the HDD, 2U chassis, rack, etc. (e.g., visco-elastic polymers, polyurethane, plastics, rubber, or any material with elastic-based properties).

Sidewalls 312 can also include one or more light pipes 540. Light pipes 540 are configured to receive a light signal (e.g., from a light emitting diode) of the backplane of the chassis and transport the signal to the front wall of the carrier 310. The light signals indicate different status of the HDD (e.g., activity, locate, failure, etc.).

Although the foregoing examples have been described in some detail for purposes of clarity of understanding, the above-described inventive techniques are not limited to the details provided. There are many alternative ways of implementing the above-described invention techniques. The disclosed examples are illustrative and not restrictive.

What is claimed is:

1. A low profile tool-less hard disk drive (HDD) carrier comprising:
   first, second, third and fourth sidewalls, the first sidewall rotatably mounted to the second sidewall, the second sidewall being rotatably mounted to the third sidewall;
   a first latch portion on the first sidewall;
   a second latch portion on the fourth sidewall configured to receive the first latch portion to enclose an HDD; and
   the third sidewall comprising:
      a slide latch configured to release a lever having at least one protrusion at an inward end, the at least one protrusion operable to couple with an opening of a chassis, engagement of the at least one protrusion with the opening acting as a fulcrum point such that a force applied to the lever toward the third sidewall converts to a rearward force to couple a HDD connector to a connector of a backplane of the chassis.

2. The carrier of claim 1, further comprising when the slide latch is actuated the lever releases from the third sidewall of the low profile tool-less carrier by a force of a dual torsion spring.

3. The carrier or claim 1, wherein when the lever is actuated the at least one protrusion engages a cutout of the chassis and the low profile tool-less carrier is coupled to the connector by a force of a dual torsion spring and the engagement.

4. The carrier of claim 1, wherein insertion of the HDD into the low profile tool-less carrier and insertion of the low profile tool-less carrier into the bay are tool-less.

5. The carrier of claim 1, wherein the low profile tool-less carrier includes one or more light pipes along one of the sidewalls configured to display a status received from a backplane.

6. The carrier of claim 1, wherein the sidewalls are composed of a material for shielding electromagnetic interference.

7. The carrier of claim 1, wherein the sidewalls are composed of a material for absorbing vibration.

8. A two rack unit chassis comprising:
a plurality of hard disk drive (HDD) bays, each bay including an attachment portion for coupling a low profile tool-less carrier in a combination of vertical and horizontal alignments, wherein the low profile tool-less carrier comprises first, second, third and fourth sidewalls, the first sidewall rotatably mounted to the second sidewall, the second sidewall being rotatably mounted to the third sidewall;
a backplane including a plurality of connectors corresponding to the plurality of bays, each bay configured to receive a low profile tool-less carrier; and
connectors in the chassis configured to engage a lever of the carrier to serve as a fulcrum point to drive the chassis into the backplane.

9. The chassis of claim 8 wherein the bays include a subset of vertical bays and horizontal bays.

10. The chassis of claim 8 wherein the subset of vertical bays include eight bays.

11. A two rack unit chassis system with low profile tool-less carriers comprising:
a plurality of hard disk drive (HDD) bays and a backplane including a plurality of connectors corresponding to the plurality of bays, each bay configured to receive a low profile tool-less carrier, wherein the low profile tool-less carrier comprises first, second, third and fourth sidewalls, the first sidewall rotatably mounted to the second sidewall, the second sidewall being rotatably mounted to the third sidewall; and
a plurality of low profile tool-less carriers, each low profile tool-less carrier comprising:
a first latch configured to release a sidewall of the low profile tool-less carrier and receive an HDD; and
a second latch configured to release a lever having at least one protrusion at an inward end, the at least one protrusion operable to couple with an opening of a chassis of the chassis system, engagement of the at least one protrusion with the opening acting as a fulcrum point such that a force applied to the lever toward the third sidewall converts to a rearward force to couple a HDD connector to a connector of a backplane of the chassis.

12. The chassis system of claim 11, wherein the plurality of HDD bays includes eight vertical bays and twenty horizontal bays.

13. The chassis system of claim 11, further comprising when the second latch is actuated the lever releases from a front wall of the low profile tool-less carrier by a force of a dual torsion spring.

14. The chassis system of claim 11, wherein when the lever is actuated the at least one protrusion engages a cutout of the chassis and the low profile tool-less carrier is coupled to the backplane by a force of a dual torsion spring and the engagement.

15. The chassis of system claim 11, wherein insertion of the HDD into the low profile tool-less carrier and insertion of the low profile tool-less carrier into the bay are tool-less.

16. The chassis system of claim 11, wherein the low profile tool-less carrier includes one or more light pipes along a second sidewall configured to display a status received from the backplane.

17. The chassis system of claim 11, wherein the sidewalls are composed of a material for shielding electromagnetic interference.

18. The chassis system of claim 11, wherein the sidewalls are composed of a material for absorbing vibration.

19. The carrier of claim 1, wherein the third sidewall is not rotatable relative to the fourth sidewall.

* * * * *